United States Patent
Sugarman et al.

(10) Patent No.: US 6,986,185 B2
(45) Date of Patent: Jan. 17, 2006

(54) METHODS AND APPARATUS FOR DETERMINING SCRUBBER BRUSH PRESSURE

(75) Inventors: Michael N. Sugarman, San Francisco, CA (US); Vladimir Galburt, Campbell, CA (US)

(73) Assignee: Applied Materials Inc., Santa Clara, CA (US)

( * ) Notice: Subject to any disclaimer, the term of this patent is extended or adjusted under 35 U.S.C. 154(b) by 316 days.

(21) Appl. No.: 10/283,030

(22) Filed: Oct. 29, 2002

(65) Prior Publication Data

US 2003/0111095 A1 Jun. 19, 2003

Related U.S. Application Data

(60) Provisional application No. 60/339,992, filed on Oct. 30, 2001.

(51) Int. Cl.
   *B08B 11/00* (2006.01)

(52) U.S. Cl. .............. 15/77; 15/88.3; 15/88.4; 15/102

(58) Field of Classification Search .......... 15/77, 15/88.3, 88.4, 102
See application file for complete search history.

(56) References Cited

U.S. PATENT DOCUMENTS

| 4,382,308 A | * | 5/1983 | Curcio ..................... 15/77 |
| 6,269,510 B1 | * | 8/2001 | Beardsley et al. .......... 15/77 |
| 6,739,013 B2 | * | 5/2004 | Glashauser et al. ........ 15/102 |

* cited by examiner

*Primary Examiner*—Randall Chin
(74) *Attorney, Agent, or Firm*—Dugan & Dugan (57) ABSTRACT

In a scrubber adapted to clean a semiconductor wafer, the torque of a brush rotation motor is monitored while a scrubber brush is in contact with the wafer and is being rotated by the motor. The position of the brush relative to the wafer may be adjusted based on the monitored torque to regulate the pressure applied to the wafer by the brush. Open loop positioning or closed loop control may be employed.

37 Claims, 9 Drawing Sheets

METHODS AND APPARATUS FOR DETERMINING SCRUBBER BRUSH PRESSURE

This application claims priority from U.S. Provisional Patent Application Ser. No. 60/339,992, filed Oct. 30, 2001, which is hereby incorporated by reference herein in its entirety.

FIELD OF THE INVENTION

The present invention is concerned with manufacturing of semiconductor devices, and is more particularly concerned with cleaning a semiconductor wafer by applying at least one rotating brush to the wafer.

BACKGROUND OF THE INVENTION

Known devices, sometimes referred to as scrubbers, are often employed to clean semiconductor wafers at one or more stages of a semiconductor device manufacturing process. For example, a scrubber may be employed to clean a wafer after chemical mechanical polishing (CMP) of the wafer. Known scrubbers employ one or more scrubber brushes that are rotated while in contact with the wafer to thereby clean the wafer.

It is also known to adjust the position of a scrubber brush relative to a wafer in response to a pressure sensor which detects pressure that the scrubber brush applies to the wafer. However, the present inventors have recognized that a scrubber is a hostile environment for pressure sensors, and that conventional pressure sensors may deteriorate during use in a scrubber and interfere with operation of the scrubber's pressure regulation system.

It would therefore be desirable to provide improved methods and/or apparatus for regulating the pressure applied to a wafer by a scrubber brush.

SUMMARY OF THE INVENTION

In a first aspect of the invention, a method is provided that includes the steps of rotating a brush in contact with a wafer, monitoring a torque of a motor which rotates the brush and adjusting a position of the brush relative to the wafer based on the monitored torque.

In a second aspect of the invention, a method is provided for monitoring a pressure applied between a brush and a wafer. The method includes the steps of (1) monitoring a first torque of a motor as the motor rotates the brush while the brush is not contacting a wafer; (2) contacting a wafer with the brush; (3) monitoring a second torque of the motor as the motor rotates the brush while the brush is contacting the wafer; and (4) subtracting the first torque from the second torque to obtain a net torque resulting from pressure applied between the brush and the wafer. Brush position relative to the wafer then is adjusted based on the net torque.

In a third aspect of the invention, a method is provided that includes the steps of (1) placing a wafer between a first brush having a first end and a second end and a second brush having a first end and a second end; (2) rotating the first and second brushes with a motor; (3) scrubbing the wafer with the first and second brushes; and (4) monitoring a torque of the motor during scrubbing. The monitored torque then is employed to adjust a position of the first ends of the first and second brushes and the second ends of the first and second brushes so as to maintain a predetermined pressure on the wafer during scrubbing.

Numerous other aspects are provided, as are apparatus, systems and computer program products in accordance with these and other aspects of the invention. Each computer program product described herein may be carried by a medium readable by a computer (e.g., a carrier wave signal, a floppy disc, a compact disc, a DVD, a hard drive, a random access memory, etc.).

Other features and aspects of the present invention will become more fully apparent from the following detailed description, the appended claims and the accompanying drawings.

DETAILED DESCRIPTION

Figure 1:
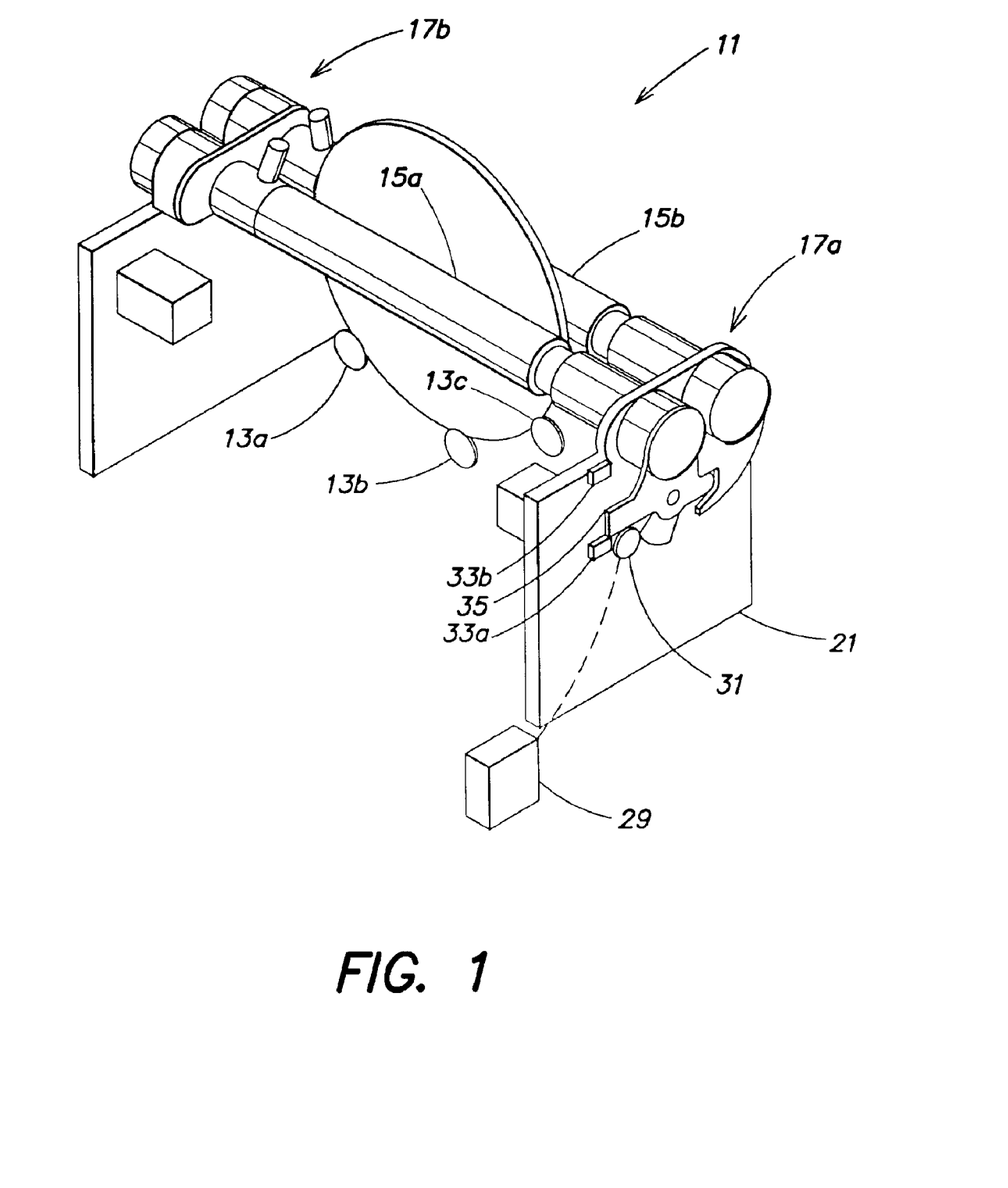
FIG. 1 is a side perspective view of an inventive scrubber taken from above.

FIG. 1 is a side perspective view of an inventive scrubber 11 taken from above, and FIGS. 2A–B and 3A–B are a top plan view, and a side elevational view of the scrubber 11, shown in an opened position and a closed position, respectively. As shown in FIG. 1, the inventive scrubber 11 comprises a plurality of rollers 13a–c on which a wafer W may be supported and/or rotated via one or more roller motors (not shown). Other numbers and/or positions of rollers may be employed. A pair of scrubber brushes 15a–b is located above the rollers 13a–c with the brushes 15a–b positioned so as to extend along opposite sides of the wafer W. A motor M is coupled to and is adapted to drive the scrubber brushes 15a–b at a desired rotational speed (e.g., typically about 50 to 700 RPM, although other speeds may be used). Alternatively, multiple motors may be employed to rotate the scrubber brushes 15a–b (e.g., a separate motor for each scrubber brush).

Each of the scrubber brushes 15a–b is mounted above the rollers 13a–c via a pair of brush mounting mechanisms 17a–b. As described further below, the first brush mounting mechanism 17a allows a first end $E_1$ (FIG. 2A) of the brushes 15a–b to be positioned relative to the wafer W independently of a second end $E_2$ of the brushes 15a–b (e.g., the respective longitudinal axes of the scrubber brushes 15a–b may form an angle). This feature may be used, for example, to clean a bevel of a wafer (in addition to or rather than a major surface of the wafer, using the same or a different pressure than that used to clean a major surface of the wafer).

In at least one embodiment of the invention, each of the brush mounting mechanisms 17a–b comprises a pair of pivotable plates 19a, 19b. For example, FIGS. 2B and 3B shows the pivotable plates 19a, 19b of the first brush mounting mechanisms 17a. As shown in FIGS. 2B and 3B, the pivotable plates 19a, 19b are each mounted to a support base 21 via a pivotable joint 23a–b, respectively. The pivotable plates 19a, 19b are coupled to each other via a cam follower arrangement wherein, for example, the first pivotable plate 19a comprises a cam 25 that extends into a follower groove 27 formed on the second pivotable plate 19b. Thus when a first one of the pivotable plates 19a, 19b pivots (e.g., about pivotable joint 23a or 23b), a second one of the pivotable plates 19a, 19b pivots symmetrically therewith (with respect to a center line L that extends centrally between the pair of pivotable joints 23a–b). Accordingly, the respective ends of the scrubber brushes 15a–b coupled to the pivotable plates 19a–b move in a coordinated manner with the pivotable plates 19a–b. For example, if end $E_1$ of scrubber brush 15a moves toward wafer W (through pivoting of pivotable plate 19a), end $E_1$ of scrubber brush 15b similarly moves toward wafer W due to the interaction of pivotable plates 19a–b (e.g., respective scrubber brush ends will move toward or away from one another simultaneously and/or at the same rate). Other mechanisms for coordinating motion of the scrubber brushes 15a–b may be employed.

Alternatively, the scrubber brushes each may be moved independently.

Figure 2A:
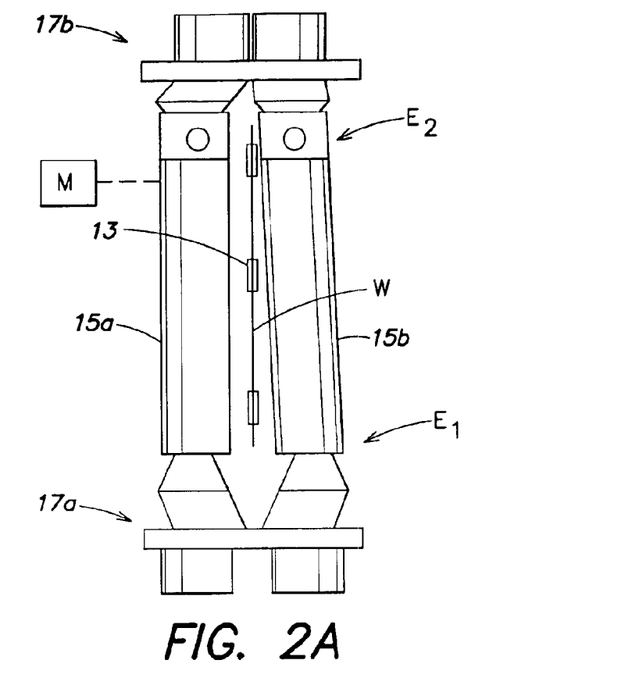
FIG. 2A is a top plan view of the inventive scrubber shown in an opened position.
Figure 2B:
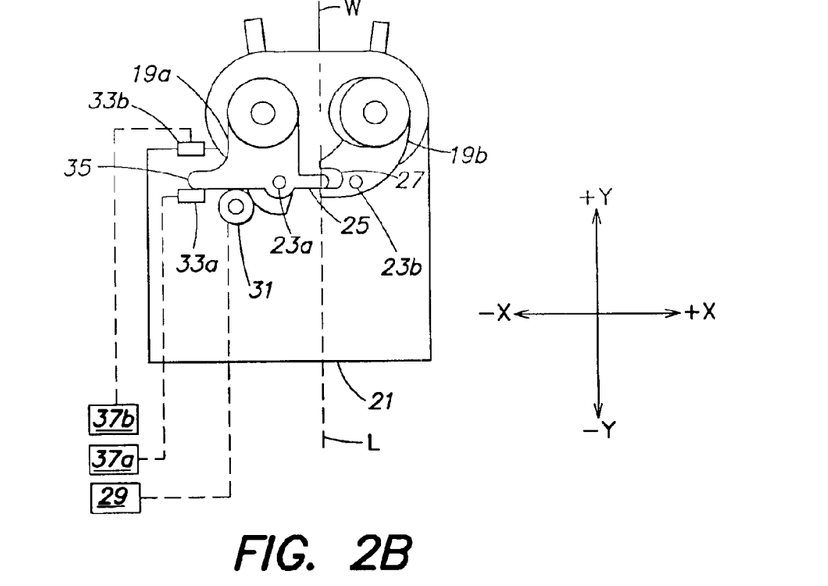
FIG. 2B is a side elevational view of the inventive scrubber, shown in the opened position.
Figure 3A:
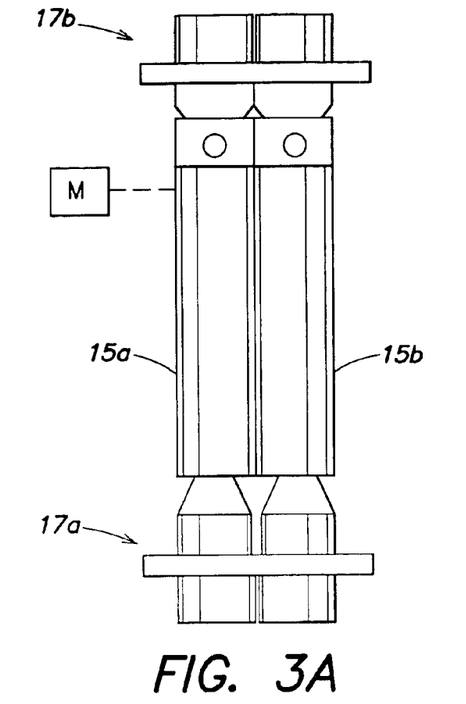
FIG. 3A is a top plan view of the inventive scrubber, shown in a closed position.
Figure 3B:
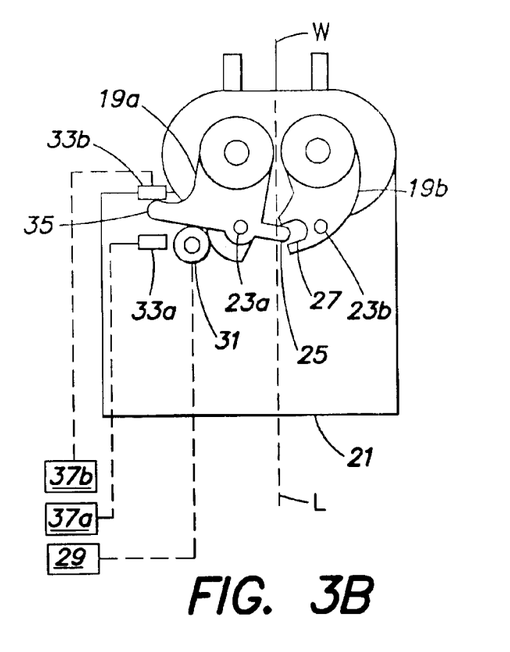
FIG. 3B is a side elevational view of the inventive scrubber, shown in the closed position.

In one exemplary embodiment of the invention, one or more actuating mechanisms (referred to generally by reference numerals 29, 31) may be coupled to the first pivotable plate 19a and/or the second pivotable plate 19b and rotate the pair of pivotable plates 19a, 19b between the opened position, in which the scrubber brushes 15a–b do not contact the wafer W, as shown in FIGS. 2A–B; and the closed position, in which the scrubber brushes 15a–b contact the wafer W, as shown in FIGS. 3A–B. For example, the one or more actuating mechanisms 29, 31 may comprise a motor which drives a gear, lead screw or other transmission mechanism coupled to the pivotable plate 19a and/or 19b, a gas source which drives one or more pneumatic actuators coupled to the pivotable plate 19a and/or 19b or any other suitable actuating mechanisms.

Each brush mounting mechanism 17a–b may include a pair of limit sensors 33a, 33b (FIGS. 2B and 3B) positioned so as to detect when the brushes 15a–b are in a desired position (as described further below). For example, with reference to FIG. 2B, the limit sensor 33a may sense the proximity of a flange 35 (which, for example, extends outwardly from the first pivotable plate 19a) when the first end $E_1$ of each brush 15a–b is in the opened position (FIGS. 2A–B). As shown in FIG. 3B, the second limit sensor 33b may sense the proximity of the flange 35 when the first end $E_1$ of each scrubber brush 15a–b is in the closed position (FIGS. 3A–B). The position of the second end $E_2$ of each brush 15a–b similarly may be detected via the brush mounting mechanism 17b. The limit sensors 33a–b may comprise, for example, an actuatable switch such as a microswitch, an optical detection system such as a through beam or reflection based sensor, or the like. When a pneumatic actuating or similar mechanism is employed to open and close the brushes 15a–b, the limit sensors 33a, 33b may be coupled to and/or comprise hard stops (not separately shown) that define (e.g., physically limit) a range of motion of the pivotable plates 19a–b.

With reference to FIGS. 2B and 3B and the first brush mounting mechanisms 17a, a first limit sensor motor 37a is coupled to the first limit sensor 33a, and a second limit sensor motor 37b is coupled to the second limit sensor 33b such that the position of the limit sensors 33a and 33b (and/or hard stops coupled thereto) may be adjusted. For example, moving the second limit sensor 33b in the +y direction (FIG. 2B) will allow:

(1) the pivotable plate 19a (and thus the first brush 15a) to pivot farther in the +x direction, closer to the wafer W (e.g., increasing the pressure with which the first brush 15a contacts the wafer W); and (2) the pivotable plate 19b (and thus the second brush 15b) to pivot farther in the −x direction, closer to the wafer W (e.g., increasing the pressure with which the second brush 15b contacts the wafer W).

Alternatively, movement of the second limit sensor 33b in the −y direction will reduce the pressure with which the first and second brushes 15a–b contact the wafer W. Likewise, moving the first limit sensor 33a in the +y direction will decrease the distance between the first and second brushes 15a–b when the scrubber 11 is in an opened condition (FIG. 2B); and moving the first limit sensor 33a in the −y direction will increase the distance between the first and second brushes 15a–b when the scrubber 11 is in an opened condition.

As stated, the first brush mounting mechanism 17a is mounted to the first end $E_1$ of each scrubber brushes 15a–b, and the second scrubber brush mounting mechanism 17b is mounted to the second end $E_2$ of each scrubber brushes 15a–b. Thus each end of each scrubber brush 15a–b may be independently positioned by adjusting (via the limit sensor motors 37a–b) the position of the limit sensors 33a–b (and/or hard stops coupled thereto) of each respective brush mounting mechanism 17a–b. For example, the brushes 15a–b may be positioned so as to be closer together on one end than on the other end (e.g., for bevel cleaning). Alternatively, both ends of the brushes may be spaced by the same distance.

To maintain consistent cleaning of wafers within the scrubber 11, each of the scrubber brushes 15a–b should contact each wafer with a consistent pressure, whether the wafer is the first wafer processed or the last wafer processed. In accordance with the present invention, the inventive scrubber 11 may monitor the torque experienced by the scrubber brush rotation motor M (FIGS. 2A and 3A) during cleaning, and in one or more embodiments, may adjust the position of the scrubber brushes 15a–b based on the monitored torque. Because the torque experienced by the rotation motor M varies in direct relationship with the pressure applied between the scrubber brushes 15a–b and the wafer W, a desired brush pressure can be maintained (e.g., by maintaining the torque experienced by the scrubber brush rotation motor M at a predetermined level and/or within a predetermined range as described further below).

Figure 4A:
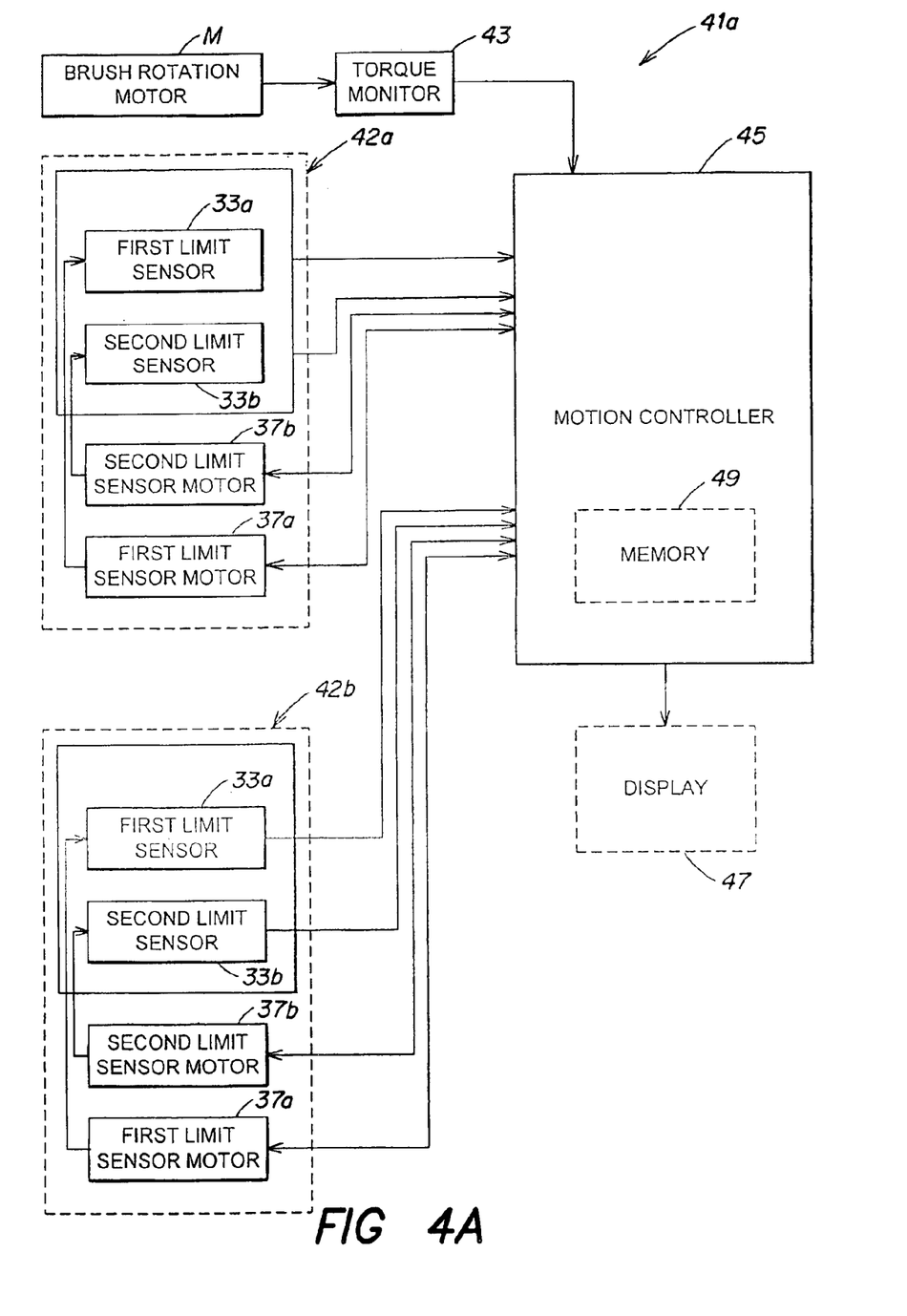
FIG. 4A is a block diagram of a first inventive brush pressure control system.

FIG. 4A is a block diagram of a first exemplary brush pressure control system 41a provided in accordance with the present invention for use with the inventive scrubber 11 of FIGS. 1–3B. As shown in FIG. 4A, the brush control system 41a includes (1) a first end pressure control subsystem 42a having the limit sensors 33a–b and limit sensor motors 37a–b for the first brush mounting mechanism 17a and that may be used to control brush pressure at the first end $E_1$ (FIG. 2A) of the scrubber 11; and (2) a second end pressure control subsystem 42b having the limit sensors 33a–b and limit sensor motors 37a–b for the second brush mounting mechanism 17b and that may be used to control brush pressure at the second end $E_2$ (FIG. 2A) of the scrubber 11.

In addition to the motors and sensors described above, the brush pressure control system 41a includes a torque monitor 43 coupled to the brush rotation motor M, and a motion controller 45 coupled to and adapted to receive a torque feedback signal from the torque monitor 43. In one or more embodiments of the invention, and in response to the torque feedback signal, the motion controller 45 may determine a brush position and/or adjustment required to maintain a predetermined torque value and/or range for the rotation motor M, and appropriate output power and/or other control signals to the limit sensor motors 37a–b of each end pressure control subsystem 42a, 42b. The limit sensor motors 37a–b may in turn adjust the position of the limit sensors 33a–b (and/or hard stops coupled thereto) of each end pressure control subsystem 42a, 42b so as to achieve the desired brush positions. In at least one embodiment, encoders (not shown) may be coupled between the brush rotation motor M and the torque monitor 43, as well as between the motion controller 45 and the position sensor motors 37a–b, for communicating information therebetween.

The torque monitor 43 may comprise, for example, an amplifier such as a proportional integral derivative (PID) amplifier or another amplifier that amplifies a torque signal output from the brush rotation motor M, or any other suitable control logic. The torque monitor 43 also may include a filter (e.g., a low pass filter) or other signal processing elements. For example, the drive current supplied to the rotation motor M during use is proportional (or otherwise related) to the torque of the motor M, and may be monitored and/or employed as a torque signal. The motor system may have a digital or analog output that is proportional to drive current, or a separate current probe may be employed to monitor drive current. The motion controller 45 may contain, for example, a look-up table that correlates torque values (e.g., output by the torque monitor 43) to brush position or position adjustments, that contains adjusted brush positions that are correlated to the number of wafers processed or to the total processing time, etc., as further described below with reference to the various brush positioning control operating modes for the scrubber 11. Alternatively, or additionally, the motion controller 45 may include logic circuitry and/or computer program code and/or algorithms for determining brush positions and/or adjustments. In one or more embodiments of the invention described below, the motion controller 45 may generate and output power signals, control signals or the like based on brush positions and/or adjustments determined by the motion controller 45. In response thereto, the limit sensor motors 37a–b may adjust the position of the limit sensors 33a–b (and/or any hard stops coupled thereto) to affect changes in brush position.

A display 47 (shown in phantom in FIG. 4A) may be coupled to the motion controller 45 and used to display information to guide an operator during adjustment of the position of the one or both ends of the scrubber brushes 15a–b. Also a storage device such as a memory 49 (shown in phantom in FIG. 4A) may be part of, or associated with, the motion controller 45 and may be used to store data indicative of desired, baseline and/or other predetermined positions of one or both ends of the scrubber brushes 15a–b (e.g., data that correlates torque to brush position, motor position, motor speed, etc.). Such data may be based on, for example, numerous samples (e.g., RMS data or other statistical data).

In additional to the limit sensors 33a–b described above, the brush pressure control system 41a may include one or more brush position home sensors (not shown) which are adapted to detect when each end of the brushes 15a–b is in a home position. For example, a reflection-based or through beam sensor system may be employed to detect when the pivot plate 19a or 19b (or a flange or opening thereof) is in a predetermined position, and communicate such information to the motion controller 45. A mechanical or other switch also may be used.

Figure 4B:
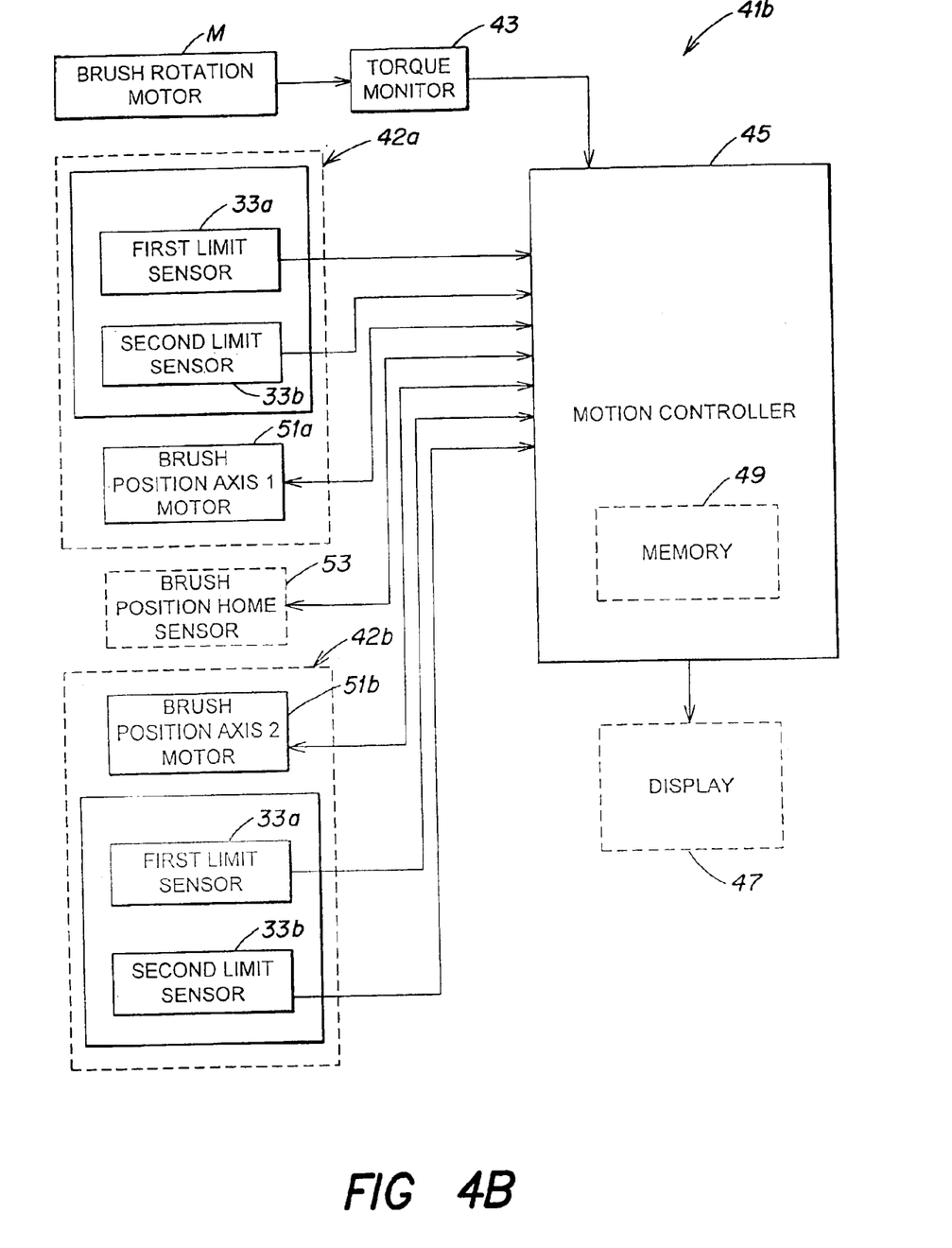
FIG. 4B is a block diagram of a second inventive brush pressure control system.

FIG. 4B is a block diagram of a second exemplary brush pressure control system 41b provided in accordance with the present invention for use with an embodiment of the inventive scrubber 11 of FIGS. 1–3B wherein the one or more actuating mechanisms (reference numbers 29 and 31 in FIG. 1) comprise one or more motors, such as a conventional stepper motor, that drive one or more lead screws or other similar mechanisms so as to accurately pivot the pivotable plate 19a of each brush mounting mechanism 17a–b about the pivot joint 23a (and thus pivot the pivotable plate 19b about the pivot joint 23b). Specifically, a motor/actuating mechanism may pivot each pivotable plate 19a of each brush mounting mechanism 17a–b by a predetermined amount in response to one or more commands from the motion controller 45 so as to accurately position the brushes 15a–b relative to the wafer W. Because the brushes 15a–b may be directly and accurately positioned via the one or more motor/actuating mechanisms, the limit sensors 33a–b need not be used, or may be used only as absolute stops/limits. For example, the first limit sensor 33a of each brush mounting mechanism 17a–b (FIG. 1) may be used to prevent the brushes 15a–b from opening too widely and damaging the brush mounting mechanisms 17a–b when a wafer is to be loaded into or removed from the scrubber 11 (e.g., by signaling the motion controller 45 to halt movement of the motor that drives the pivotable plate 19a when the flange 35 of each pivotable plate 19a contacts its respective limit sensor 33a). Likewise, the second limit sensor 33b of each brush mounting mechanism 17a–b may be used to prevent the brushes 15a–b from coming too close to (and potentially damaging) a wafer during scrubbing (e.g., by signaling the motion controller 45 to halt movement of the motor that drives the pivotable plate 19a when the flange 35 of each pivotable plate 19a contacts its respective limit sensor 33b). In such an embodiment, the position of each limit sensor 33a–b may be fixed.

As shown in FIG. 4B, the brush rotation motor M, the torque monitor 43, the motion controller 45, the display 47 and/or the memory 49 of the second brush pressure control system 41b may be similar to that of the first brush pressure control system 41a of FIG. 4A. However, in the second brush control system 41b of FIG. 4B, the first end pressure control subsystem 42a includes (1) first and second limit sensors 33a–b that have a fixed position (e.g., and define absolute limits of travel for the first end $E_1$ of each brush 15a–b as described previously); and (2) a brush position axis 1 motor 51a that serves as the actuating mechanism for the pivotable plate 19a of the first brush mounting mechanism 17a. The brush position axis 1 motor 51a is adapted to receive a position signal (or position adjustment signal) from the motion controller 45 and, in response thereto, move the first end $E_1$ of the brushes 15a–b (via the pivotable plate 19a of the first brush mounting mechanism 17a) to a desired position. For example, the position or position adjustment signal applied to the brush axis 1 motor 51a may be a power signal and/or one or more control signals that drive the motor 51a in a forward or reverse direction, for a predetermined time period and/or number of steps, at a predetermined rate, and/or the like.

Likewise, the second end pressure control subsystem 42b of the second brush control system 41b of FIG. 4B includes (1) first and second limit sensors 33a–b that have a fixed position (e.g., and define absolute limits of travel for the second end $E_2$ of each brush 15a–b as described previously); and (2) a brush position axis 2 motor 51b that serves as the actuating mechanism for the pivotable plate 19a of the second brush mounting mechanism 17b. The brush position axis 2 motor 51b is adapted to receive a position signal (or position adjustment signal) from the motion controller 45 and, in response thereto, move the second end $E_2$ of the brushes 15a–b (via the pivotable plate 19a of the second brush mounting mechanism 17b) to a desired position. For example, the position or position adjustment signal applied to the brush axis 2 motor 51b may be a power signal and/or one or more control signals that drive the motor 51b in a forward or reverse direction, for a predetermined time period and/or number of steps, at a predetermined rate, and/or the like.

As shown in FIG. 4B, the second brush control system 41b includes one or more brush position home sensors 53 coupled to the motion controller 45. For example, a reflection-based or through beam sensor system may be employed to detect when the pivot plate 19a or 19b (or a flange or opening thereof) is in a predetermined position, and communicate such information to the motion controller 45. A mechanical or other switch also may be used. Such home position sensors provide an absolute (or "home") position or reference for the brushes 15a–b (and the control system 41b) and are particularly relevant to the second brush control system 41b wherein the limit sensors are employed as absolute limits of travel.

With the brush mounting mechanisms 17a–b and the brush pressure control systems 41a–b thus described, exemplary brush positioning operations of the inventive scrubber 11 will now be described. Specifically, the following brush positioning modes of operation are described: (1) open loop brush positioning; (2) open loop brush positioning with torque monitoring; and (3) closed loop brush pressure control. Other brush positioning modes/operations may be performed.

Figure 5A:
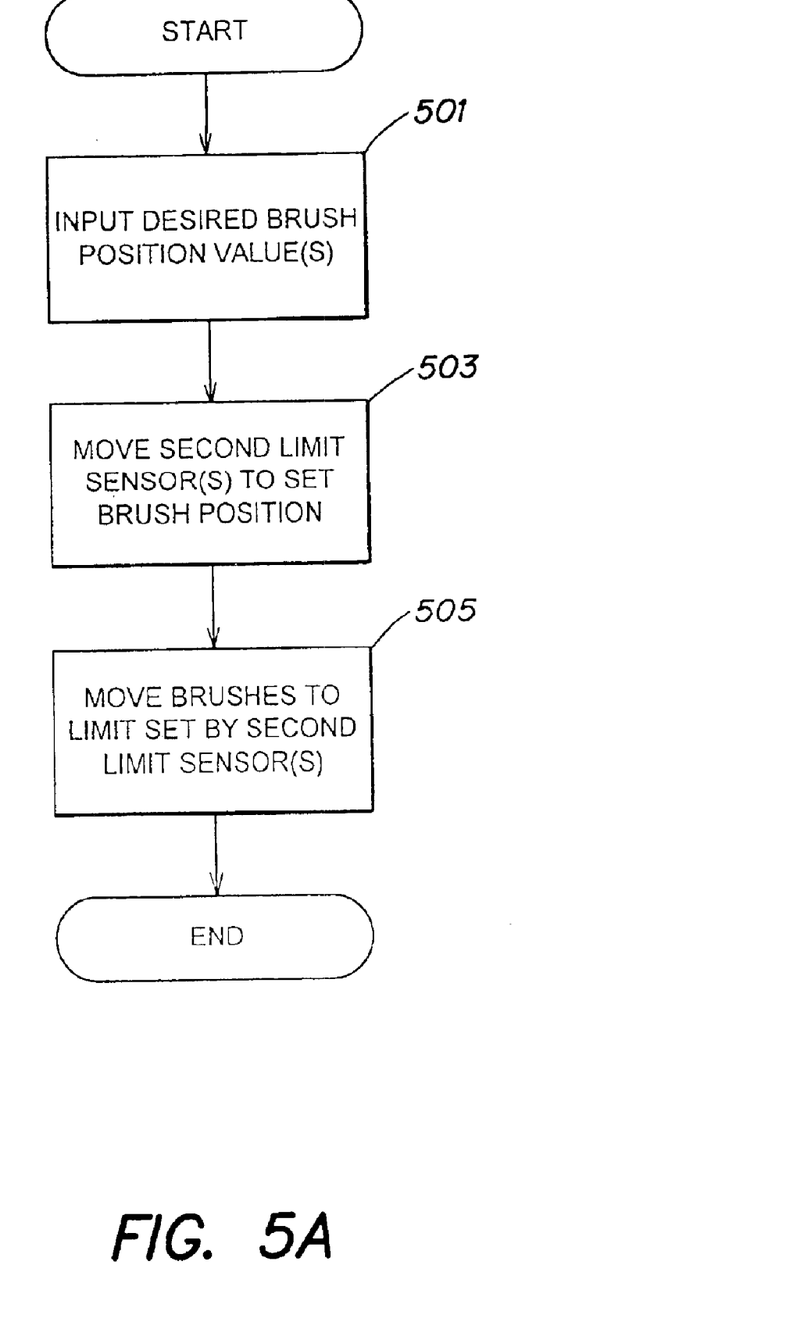
FIGS. 5A–5C and 6 are flow charts that illustrate various modes of operation that may be performed by the inventive apparatus of FIGS. 1–4B.

FIG. 5A is a flow chart that illustrates an open loop brush positioning mode of operation for the inventive scrubber 11. When operating in the open loop brush positioning mode, and as indicated by step 501 in FIG. 5A, an operator inputs a desired brush position value (or values) for the ends of the brushes 15a–b to be used during wafer scrubbing (e.g., a distance between each end of a respective one of the scrubber brushes 15a–b and a position at which a wafer will be supported, such as a center of a wafer supporting groove of the rollers 13a–c). Such a value alternatively may be measured relative to a home position (as previously described). The value (or values) may be input, for example, via a user interface of a recipe control system (not shown) coupled to the motion controller 45.

Assuming the first brush pressure control system 41a is employed, following step 501, the motion controller 45 (FIG. 4A) may determine a position for the second limit sensor 33b (and/or hard stop) of each end pressure control subsystem 42a, 42b and direct the respective second limit sensor motor 37b of each subsystem to drive the second limit sensor 33b (and/or hard stop) to a predetermined position (step 503, FIG. 5A). Thereafter, in step 505, the motion controller 45 may direct the one or more actuating mechanisms 29, 31 (e.g., a motor/gear, a gas source/pneumatic actuator, etc.) to pivot the pivotable plate 19a (and thus the pivotable plate 19b) of each end pressure control subsystem 42a, 42b until the second limit sensor 33b of each end pressure control subsystem 42a, 42b senses the respective flange 35 of each pivotable plate 19a. In one or more embodiments of the invention, contact between the flange 35 of the pivotable plate 19a of a subsystem 42a–b and the limit sensor 33b of the subsystem 42a–b will cause the limit sensor 33b to signal the motion controller 45. In response thereto, the motion controller 45 may limit further actuation by the one or more actuating mechanisms 29, 31 (e.g., halt motor/gear rotation). In this manner, each end of the brushes 15a–b may be positioned (e.g., independently) in accordance with the position value or values provided by the operator. Note that in this mode of operation, no feedback of torque information is employed to adjust brush position.

If the second brush pressure control system 41b of FIG. 4B is employed, the steps 503 and 505 may be replaced by a single step in which the motion controller 45 may directly drive the brush position axis 1 and axis 2 motors 51a, 51b in an appropriate direction, at an appropriate rate and for an appropriate time period so as to pivot the pivotable plates 19a–b of each subsystem 42a, 42b (and thus the ends of brushes 15a–b) into the desired position.

Figure 5B:
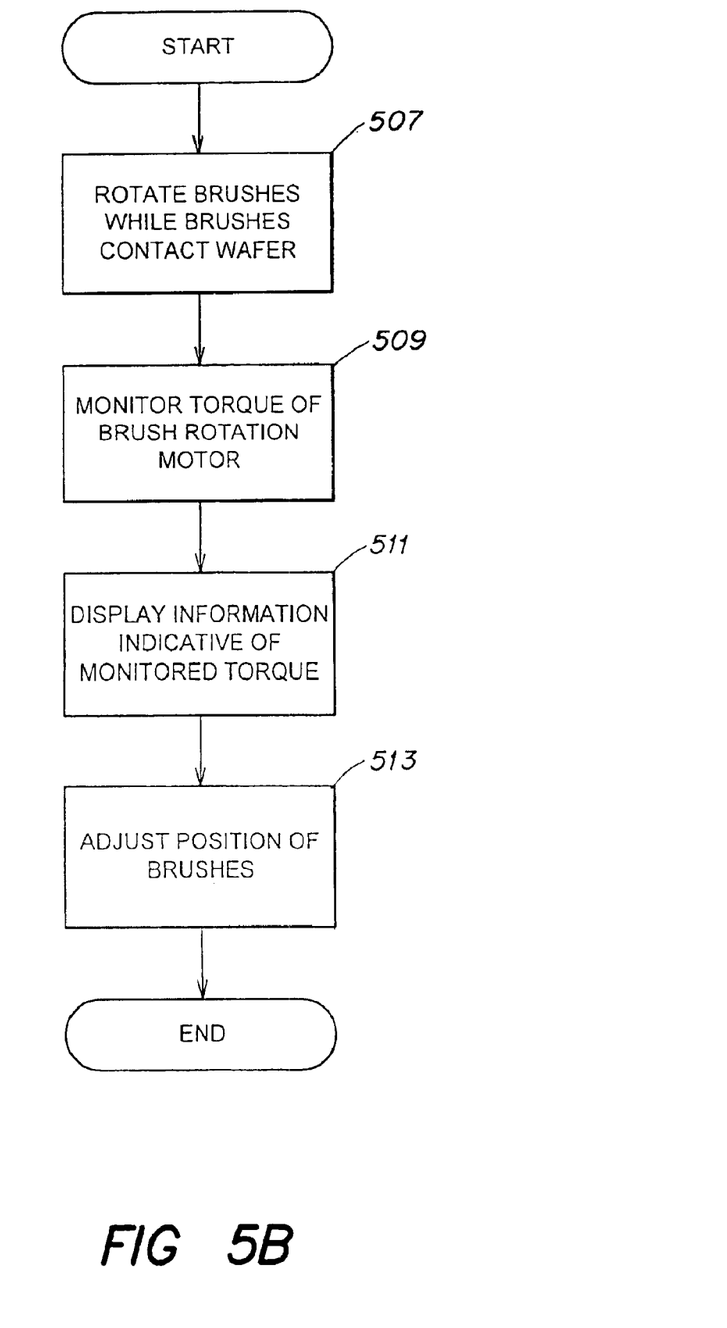

FIG. 5B is a flow chart that illustrates an open loop brush positioning with torque monitoring mode of operation for the inventive scrubber 11. When operating in the open loop brush gap positioning with torque monitoring mode, the inventive scrubber 11 operates in a similar manner to that described above, but with the addition of torque monitoring. In this mode, as the scrubber brushes 15a–b contact and scrub the wafer W (step 507), the torque experienced by the brush rotation motor N is monitored by the motion controller 45 (FIG. 4A or 4B) (step 509) and may be displayed on the display 47 (step 511). The position of the brushes 15a–b relative to the wafer W then may be adjusted (step 513).

If the control system 41a of FIG. 4A is employed, the position of the second limit sensor 33b of each brush mounting mechanisms 17a–b may be adjusted (e.g., manually, by an operator) based on changes in the rotation motor's torque. For instance, a decrease in torque during wafer scrubbing may indicate that a distance between the outside diameter of one or both ends of each scrubber brush 15a–b and the center of the grooves of the rollers 13a–c has increased. Accordingly the second limit sensor 33b (and/or hard stop) of one or both of the brush mounting mechanisms 17a–b may be adjusted (e.g., manually by an operator) so that the outside diameter of one or both ends of the scrubber brushes 15a–b is positioned closer to the center of the grooves of the rollers 13a–c, thereby maintaining a predetermined torque level (or range of torque levels) during scrubbing. Note that in the embodiment shown, moving the limit sensors 33b allows each set of pivotable plates 19a, 19b (which are coupled so as to pivot equally and oppositely) to position each end of the scrubber brushes 15a–b closer together.

The motion controller 45 may direct the display 47 to display information indicative of the monitored torque (e.g., in human readable form). Based on the displayed information, an operator may adjust the position of the brushes 15a–b via the second limit sensors 33b (for the control system 41a of FIG. 4A) or via the brush position axis 1 and 2 motors 51a–b (for the control system 41b of FIG. 4B) manually or via appropriate commands to the motion controller 45.

Figure 5C:
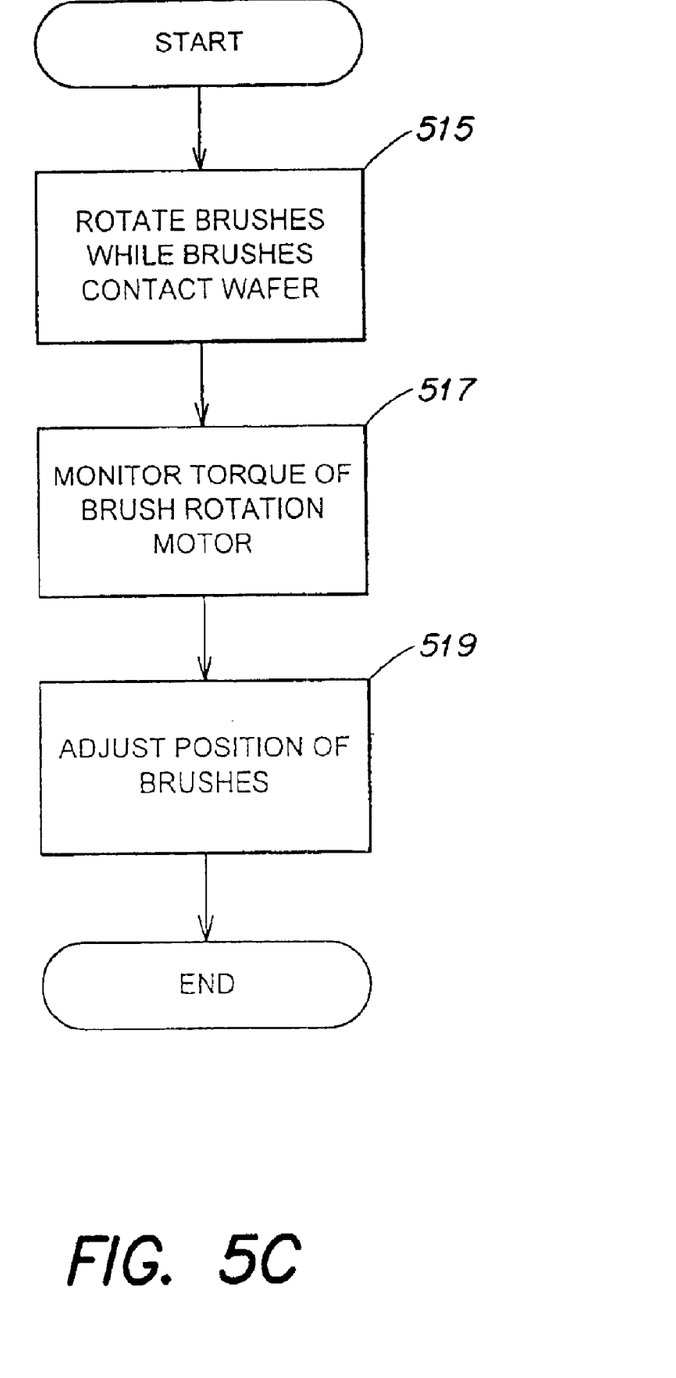

FIG. 5C is a flow chart that illustrates the closed loop brush pressure control mode. The process of FIG. 5C begins with steps 515 and 517, which may be similar to steps 507 and 509 described above in connection with FIG. 5B. Based on the monitored torque provided in step 519, the motion controller 45 may automatically adjust the operative position of one or both ends of the scrubber brushes 15a–b (step 519). For example, if the control system 41a of FIG. 4A is employed, the motion controller 45 may adjust brush position by moving the second limit sensor 33b of one or both of the brush mounting mechanisms 17a–b. In at least one embodiment, the motion controller 45 may compare the measured torque value to a desired torque value (and/or torque value range), and based thereon, may automatically adjust the position of one or both ends of the brushes 15a–b (e.g., by using a difference between the measured and desired torque values to determine a new position for each brush end and/or an adjustment in position for each brush end, and by automatically adjusting limit sensor and/or brush position based thereon). In addition to storing and/or calculating limit sensor positions that are correlated to brush position values, the brush pressure control system 41a of FIG. 4 may store and/or calculate adjusted limit sensor positions (e.g., which may have been determined based on empirical data) and use such adjusted limit sensor positions to maintain a constant pressure between the wafer W and the brushes 15a–b despite brush wear.

The brush pressure control system 41a or 41b preferably adjusts brush pressure periodically or continuously to compensate for brush wear during scrubbing operations. For example, after a given number of wafers has been processed the control system 41a may automatically adjust limit sensor positions so as to reduce the distance between the scrubber brushes 15a–b and the center of the rollers 13a–c. (The control system 41b may more directly affect brush position as previously described.) Thus, even though the scrubber brushes 15a–b may wear and have a smaller outside diameter following multiple scrubbing operations, the pressure between the scrubber brushes 15a–b and each processed wafer may remain constant or within a predetermined range.

The torque experienced by the scrubber brush rotation motor M is a combination of the torque resulting from the brush mounting mechanisms 17a–b and the torque resulting from contact between the wafer W and the scrubber brushes 15a–b. Accordingly for accurate brush pressure control, the torque resulting from the mounting mechanisms 17a–b preferably is subtracted from the torque measured by the torque monitor 43. In this manner, the brush pressure control system 41a or 41b may compensate for variations (e.g. tolerances, etc.) in the brush mounting mechanisms 17a–b between inventive scrubbers 11, following maintenance/part replacement, etc.

To determine the torque attributable to the brush mounting mechanisms 17a–b, the scrubber brushes 15a–b are moved away from the wafer w, so that the brushes may rotate freely, and the torque of the brush rotation motor M is monitored and stored (e.g., as a baseline torque). The baseline torque is the torque attributable to the brush mounting mechanisms 17a–b, and may be subtracted from subsequent torque measurements taken when the rotating brushes 15a–b are in contact with the wafer W. Preferably the power applied to the brush rotation motor M during baseline torque monitoring is the same power applied during subsequent measurements so that the only variable is the pressure applied between the brushes 15a–b and the wafer W. Measurement of the baseline torque may be performed, for example, prior to each scrubbing operation, periodically or following scrubber installation and/or servicing.

Figure 6:
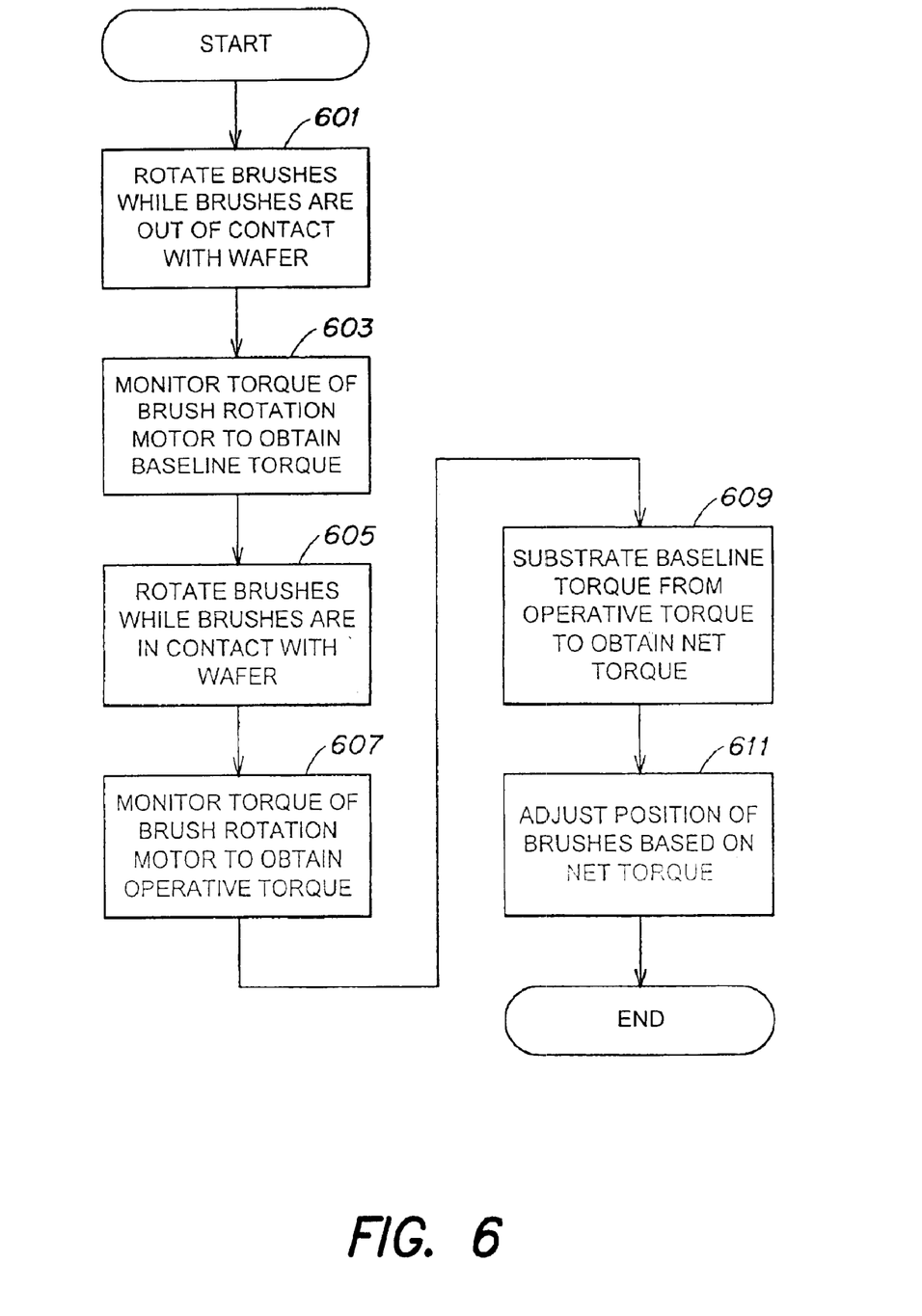

FIG. 6 is a flow chart that illustrates a process for compensating for torque due to the scrubber brush mounting mechanisms 17a–b during a brush pressure adjustment operation. The process of FIG. 6 begins with step 601, in which the scrubber brushes 15a–b are rotated while the brushes are out of contact with the wafer W (e.g. when the brushes 15a–b are in the opened position shown in FIGS. 2A and 2B). During rotation of the brushes 15a–b, the torque of the brush rotation motor M is monitored to obtain a baseline torque (step 603). Then, as indicated at step 605, the scrubber brushes 15a–b are positioned so as to contact the wafer W, and are rotated while in contact with the wafer W. During rotation of the brushes 15a–b, the torque of the brush rotation motor M is again monitored, to obtain an operating torque (step 607). As indicated at step 609, the baseline torque then is subtracted from the operating torque to obtain a net torque (e.g., the torque that results from contact between the wafer W and the brushes 15a–b).

Based on the net torque, the operative position of the scrubber brushes 15a–b (e.g., the position of each end of the scrubber brushes 15a–b relative to the wafer W) is adjusted (step 607). The adjustment off the operative position of the scrubber brushes 15a–b may be performed, for example, in accordance with the methods described previously (e.g., the processes of FIG. 5B or 5C). For example, the scrubber 11 and/or the brush pressure control system 41a or 41b may automatically adjust the operative position of the scrubber brushes 15a–b based on the net torque. Alternatively, information indicative of the net torque may be displayed via the display 47 (FIGS. 4A and 4B), and an operator may manually adjust the operative position of the scrubber brushes 15a–b based on the displayed information as previously described. As stated, measurement of the baseline torque (steps 601 and 603) need not be performed prior to each scrubbing operation, and instead may be performed, for example, periodically or following scrubber installation and/or servicing.

As used herein and in the appended claims, "information indicative of torque" (whether monitored or not) may include, but need not be limited to, information indicative of a desirable brush position or adjustment calculated based on the torque. Also as used herein and in the appended claims, an adjustment based on a "monitored" torque may include, but need not be limited to, an adjustment based on a net torque.

In a further aspect of the invention, the scrubber 11 may be configured such that a user may choose to operate in any one of the inventive modes of operation described above, or in a conventional mode that moves the brushes 15a–b to a desired position. In this aspect, torque may be monitored once the brushes 15a–b are in the desired position and brush position may be adjusted manually or automatically based on monitored torque.

As noted above, the scrubber 11 may, in one or more embodiments, be configured and/or operated such that the scrubber brushes 15a–b are not parallel to each other. That is, the respective longitudinal axes of the scrubber brushes 15a–b may form an angle, such that a distance between the first end $E_1$ (FIG. 2A) of the first scrubber brush 15a and the corresponding end of the second scrubber brush 15b is less than the distance between the second end $E_2$ of the first scrubber brush 15a and the corresponding end of the second scrubber brush 15b (or vice versa).

To facilitate this angled configuration of the scrubber brushes 15a–b and/or to facilitate adjustment of the operative position of one or both of the brushes 15a–b while preserving a desired angled configuration, the memory 49 (FIGS. 4A and 4B) may store data indicative of home, baseline and/or other desired positions of the two ends of the scrubber brushes 15a–b. For example, the memory 49 may store first data indicative of a desired position of the first end $E_1$ (FIG. 2A) of each scrubber brush 15a–b and may also store second data, which may be different from the first data, indicative of a desired position of the second end $E_2$ of each scrubber brush 15a–b. Thereafter, positioning and/or adjustment of position of the scrubber brushes 15a–b may be based at least in part on the first and second data. For example, one or more of the adjustment steps 513, 519 and 611 (FIGS. 5B, 5C and 6, respectively) may be based on the first and second data and on the monitored or net torque of the brush rotation motor M. In one particular embodiment, an offset (e.g., brush position offset, limit sensor position offset, lead screw offset, etc.) may be calculated by the motion controller 45 based on the monitored or net torque and then the offset may be added to or otherwise employed with the first data to calculate a desired adjusted position of the first end $E_1$ of each scrubber brush 15a–b and the offset may be added to or otherwise employed with the second data to calculate a desired adjusted position of the second end $E_2$ of each scrubber brush 15a–b.

The foregoing description discloses only exemplary embodiments of the invention; modifications of the above disclosed apparatus and methods which fall within the scope of the invention will be readily apparent to those of ordinary skill in the art. For example, the specific motors and other components described herein, as well as the couplings and/or connections therebetween, are merely exemplary. The use of hard stops may be employed instead of limit sensors, and both limit sensors and hard stops may be omitted in systems wherein a motor drives a lead screw or similar mechanisms (e.g., as rotation of a lead screw may provide precise positioning without the need for limit sensors or hard stops). Although the invention has been described with reference to use of a double sided vertical scrubber that employs roller-type brushes (that rotate about an axis that is approximately parallel to a wafer), the invention may be employed with other scrubber systems such as a single sided scrubber, an otherwise oriented scrubber, a scrubber that employs non-roller-type brushes (e.g., pancake-type brushes that rotate about an axis that is approximately perpendicular to a wafer), etc.

An embodiment of the invention which employs adjustment of the operative position of a scrubber brush based on monitored torque of a brush rotation motor may, but need not, also store data indicative of the respective positions of the two ends of the scrubber brush. Also, an embodiment of the invention which stores data indicative of the respective positions of the two ends of a scrubber brush may, but need not, also employ adjustment of the operative position of the scrubber brush based on monitored torque of a brush rotation motor.

Rather than adjusting brush position based on monitored torque so as to maintain a desired brush pressure, the monitored torque may be employed to signal when a worn brush should be replaced or conditioned (e.g., roughened so as to increase friction and therefore torque), cause a mechanism in a brush core to adjust brush firmness, etc., so as to maintain the desired brush pressure.

As used herein, a semiconductor wafer may include any substrate on which a semiconductor device may be formed such as a silicon substrate, a glass plate or the like.

Accordingly, while the present invention has been disclosed in connection with exemplary embodiments thereof, it should be understood that other embodiments may fall within the spirit and scope of the invention.

The invention claimed is:

1. An apparatus comprising:
    a motor adapted to couple to a brush so as to rotate a brush;
    a brush positioning mechanism including a home position sensor adapted to adjust a position of a brush relative to a wafer; and
    a controller coupled to the motor and the brush positioning mechanism and adapted to:
        monitor a torque of the motor as the motor rotates a brush while a brush contacts a wafer; and
        allow adjustment of a position of a brush relative to the wafer based on the monitored torque.

2. The apparatus of claim 1, further comprising a display coupled to the controller, and wherein the controller is adapted to display information indicative of the monitored torque on the display.

3. The apparatus of claim 1, wherein the controller is adapted to adjust the position of a brush relative to the wafer based on the monitored torque.

4. The apparatus of claim 1 wherein the brush positioning mechanism includes a limit mechanism adapted to limit motion of a brush toward the wafer.

5. The apparatus of claim 4 wherein the controller is adapted to adjust the position of a brush by adjusting a position of the limit mechanism.

6. The apparatus of claim 4 wherein the limit mechanism comprises a limit sensor.

7. The apparatus of claim 4 wherein the limit mechanism comprises a hard stop.

8. The apparatus of claim 4 wherein the limit mechanism comprises a motor.

9. The apparatus of claim 1 wherein the brush positioning mechanism comprises:
    a first brush positioning mechanism adapted to adjust a position of a first end of a brush; and
    a second brush positioning mechanism adapted to adjust a position of a second end of a brush independently of the first end of a brush.

10. The apparatus of claim 1, wherein the controller is adapted to allow adjustment of the position of a second brush relative to a wafer based on the monitored torque.

11. An apparatus comprising:
    a motor adapted to couple to a brush so as to rotate a brush;
    a brush positioning mechanism adapted to move a brush between a first position in which a brush does not contact a wafer and a second position in which a brush contacts the wafer;
    a limit mechanism adapted to define the second position; and
    a controller coupled to the motor and operative to:
        monitor a first torque of the motor as the motor rotates a brush while a brush is in the first position;
        monitor a second torque of the motor as the motor rotates a brush while a brush is in the second position and in contact with a wafer; and
        subtract the first torque from the second torque to obtain a net torque resulting from pressure applied between a brush and the wafer.

12. The apparatus of claim 11, further comprising a display coupled to the controller, wherein the controller is operative to display information indicative of the net torque on the display.

13. The apparatus of claim 11, wherein the controller is coupled to the limit mechanism and is further operative to adjust a position of the limit mechanism based on the net torque.

14. The apparatus of claim 11, wherein the limit mechanism comprises a limit sensor.

15. The apparatus of claim 11, wherein the limit mechanism comprises a hard stop.

16. The apparatus of claim 11, wherein the limit mechanism comprises a motor.

17. An apparatus comprising:
    a motor adapted to rotate a brush having a first end and a second end;

a first mechanism adapted to move the first end of a brush between a first position in which the first end of a brush is not in contact with a wafer and a second position in which the first end of a brush is in contact with the wafer;

a second mechanism adapted to move the second end of a brush between a first position in which the second end of a brush is not in contact with the wafer and a second position in which the second end of a brush is in contact with the wafer; and a controller coupled to the motor, the first mechanism and the second mechanism and adapted to:
monitor a torque of the motor as the motor rotates a brush while a brush contacts a wafer; and
allow adjustment of the position of the first and second ends of a brush relative to the wafer based on the monitored torque.

18. The apparatus of claim 17 further comprising a storage device adapted to store first data indicative of a position of the first end of a brush when a brush is in contact with a wafer and adapted to store second data indicative of a position of the second end of a brush when a brush is in contact with a wafer.

19. An apparatus comprising:
a motor adapted to couple to a brush so as to rotate a brush;
a brush positioning mechanism adapted to adjust a position of a brush relative to a wafer including:
a limit mechanism comprising a limit sensor adapted to limit motion of a brush toward the wafer; and
a controller coupled to the motor and the brush positioning mechanism and adapted to:
monitor a torque of the motor as the motor rotates a brush while a brush contacts a wafer; and
allow adjustment of a position of a brush relative to the wafer based on the monitored torque.

20. The apparatus of claim 19, further comprising a display coupled to the controller, and wherein the controller is adapted to display information indicative of the monitored torque on the display.

21. The apparatus of claim 19, wherein the controller is adapted to adjust the position of a brush relative to the wafer based on the monitored torque.

22. The apparatus of claim 19 wherein the brush positioning mechanism further includes a home position sensor.

23. The apparatus of claim 19 wherein the controller is adapted to adjust the position of a brush by adjusting a position of the limit mechanism.

24. The apparatus of claim 19 wherein the limit mechanism comprises a hard stop.

25. The apparatus of claim 19 wherein the limit mechanism comprises a motor.

26. The apparatus of claim 19 wherein the brush positioning mechanism comprises:
a first brush positioning mechanism adapted to adjust a position of a first end of a brush; and
a second brush positioning mechanism adapted to adjust a position of a second end of a brush independently of the first end of a brush.

27. The apparatus of claim 19 wherein the controller is adapted to allow adjustment of the position of a second brush relative to a wafer based on the monitored torque.

28. An apparatus comprising:
a motor adapted to couple to a brush so as to rotate a brush;
a brush positioning mechanism adapted to adjust a position of a brush relative to a wafer, the brush positioning mechanism comprising:
a first brush positioning mechanism adapted to adjust a position of a first end of a brush; and
a second brush positioning mechanism adapted to adjust a position of a second end of a brush independently of the first end of a brush; and
a controller coupled to the motor and the brush positioning mechanism and adapted to:
monitor a torque of the motor as the motor rotates a brush while a brush contacts a wafer; and
allow adjustment of a position of a brush relative to the wafer based on the monitored torque.

29. The apparatus of claim 28, further comprising a display coupled to the controller, and wherein the controller is adapted to display information indicative of the monitored torque on the display.

30. The apparatus of claim 28, wherein the controller is adapted to adjust the position of a brush relative to the wafer based on the monitored torque.

31. The apparatus of claim 28 wherein the brush positioning mechanism includes a limit mechanism adapted to limit motion of a brush toward the wafer.

32. The apparatus of claim 31 wherein the controller is adapted to adjust the position of a brush by adjusting a position of the limit mechanism.

33. The apparatus of claim 31 wherein the limit mechanism comprises a limit sensor.

34. The apparatus of claim 31 wherein the limit mechanism comprises a hard stop.

35. The apparatus of claim 31 wherein the limit mechanism comprises a motor.

36. The apparatus of claim 28 wherein the brush positioning mechanism further includes a home position sensor.

37. The apparatus of claim 28, wherein the controller is adapted to allow adjustment of the position of a second brush relative to a wafer based on the monitored torque.

* * * * *